United States Patent [19]
Hughes

[11] 3,862,930
[45] Jan. 28, 1975

[54] RADIATION-HARDENED CMOS DEVICES AND CIRCUITS

[75] Inventor: Harold L. Hughes, Hillcrest Heights, Md.

[73] Assignee: The United States of America as represented by the Secretary of the Navy, Washington, D.C.

[22] Filed: Aug. 22, 1972

[21] Appl. No.: 282,811

[52] U.S. Cl. .................... 117/201, 117/93, 148/1.5
[51] Int. Cl. .................... H01j 7/00, H01j 1/13
[58] Field of Search ...... 117/201, 93; 148/1.5, 10 N

[56] References Cited

UNITED STATES PATENTS

| | | | |
|---|---|---|---|
| 3,390,019 | 6/1958 | Manchester | 148/1.5 |
| 3,515,956 | 6/1970 | Martin | 148/1.5 |
| 3,595,716 | 7/1971 | Kerr | 148/187 |
| 3,635,767 | 1/1972 | Tsuchimoto | 148/1.5 |
| 3,660,171 | 5/1972 | Tsuchimoto et al. | 148/1.5 |
| 3,756,861 | 9/1973 | Payne | 148/1.5 |
| 3,759,763 | 9/1973 | Wang | 148/1.5 |
| 3,765,961 | 10/1973 | Mar | 117/201 |
| 3,793,088 | 2/1974 | Eckton | 148/1.5 |

*Primary Examiner*—Mayer Weinblatt
*Assistant Examiner*—Michael F. Esposito
*Attorney, Agent, or Firm*—R. S. Sciascia; Arthur L. Branning; Philip Schneider

[57] ABSTRACT

A technique of reducing the radiation sensitive nature of both P-channel and N-channel components of a CMOS structure. The channel oxide in both components is grown as pure as possible during the manufacture with a special attempt to keep the alkali content low. After the manufacturing process is complete, the P-channel component is masked while the entire N-channel component is subjected to an ion implantation which radiation hardens the entire CMOS device or circuit. This process provides a CMOS device which maintains a useable threshold level in the presence of and after it has been exposed to $10^6$ rad of radiation.

5 Claims, 3 Drawing Figures

RADIATION-HARDENED CMOS DEVICES AND CIRCUITS

BACKGROUND OF THE INVENTION

Complementary-Metal-Oxide-Semiconductors (CMOS) have extremely desirable performance characteristics. For example, attributes such as low noise, ultra-low standby voltages and power consumption, good threshold levels and most importantly a very high packing density ($10^6$ devices/square inch) make the CMOS very attractive in the area of missiles and space technology. However, the CMOS is highly sensitive to ionizing radiation which adversely effects its threshold level, and when confronted with the environment of the upper atmosphere or radiation produced by weapons steps must be taken to protect the CMOS from deterioration which results from such radiation.

The prior art has recognized the versatility of the CMOS, and due to its radiation sensitive nature, an application in space science and other hostile environments has been limited. Considering such drawbacks, I have developed a technique to radiationharden CMOS devices and circuits such that their use may be extended into environments having any type of radiation.

SUMMARY OF THE INVENTION

A CMOS device is manufactured in the typical, well-known manner throughout the process of doping. Special steps are then provided to grow a pure oxide ($SiO_2$) in the channels of both the N and P-channel transistors. The silicon dioxide gate-dielectrics of the N-channel transistors are subjected to an ion implantation, such as $Al^+$, while the P-channel component remains masked such that the implantation only takes place in the N-channel component. As a manufacturing expedient, the well known p-well mask which was previously used to form the p-well diffusion region of the N-channel transistor may be employed for this masking purpose. The aluminum gate metalization may then be sintered at a controlled temperature to optimize the impurity content in the upper regions of the gate dielectrics. This procedure allows the realization of radiation hard CMOS devices and circuits heretofore unattainable.

OBJECTS OF THE INVENTION

It is an object of the present invention to provide CMOS devices and circuits which are essentially insensitive to radiation, including radiation of the order of $10^6$ rads.

Another object of the invention is to provide a CMOS device which is able to maintain an essentially constant threshold level in the presence of such radiation.

A further object of the invention is to manufacture a radiation hard CMOS by techniques inherently compatible with present commercial processes.

Other objects, advantages and novel features of the invention will become apparent from the following detailed description of the invention when considered in conjunction with the accompanying drawings wherein:

DRAWINGS

DETAILED DESCRIPTION

Figure 1:
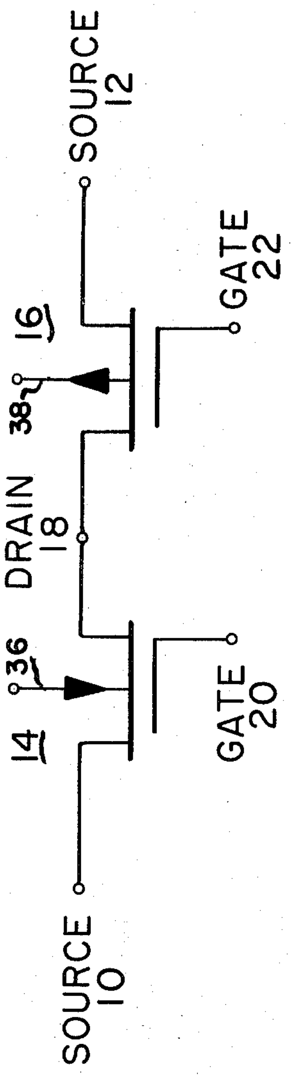
FIG. 1 is a typical CMOS device shown in schematic form depicting the N and the P transistors.

Referring to FIG. 1, a schematic of the well known complementary-metal-oxide-semiconductors is shown and may be considered to be divided into two halves 14 and 16, wherein each half is a transistor section of opposite polarity with respect to the other. The sectional half 14 is shown as an N-channel device, and the complementary section 16 is of P-channel. The two sections may be connected by a common drain such as drain 18 and each have their individual sources 10 and 12, and gates 20 and 22, respectively.

Figure 2:
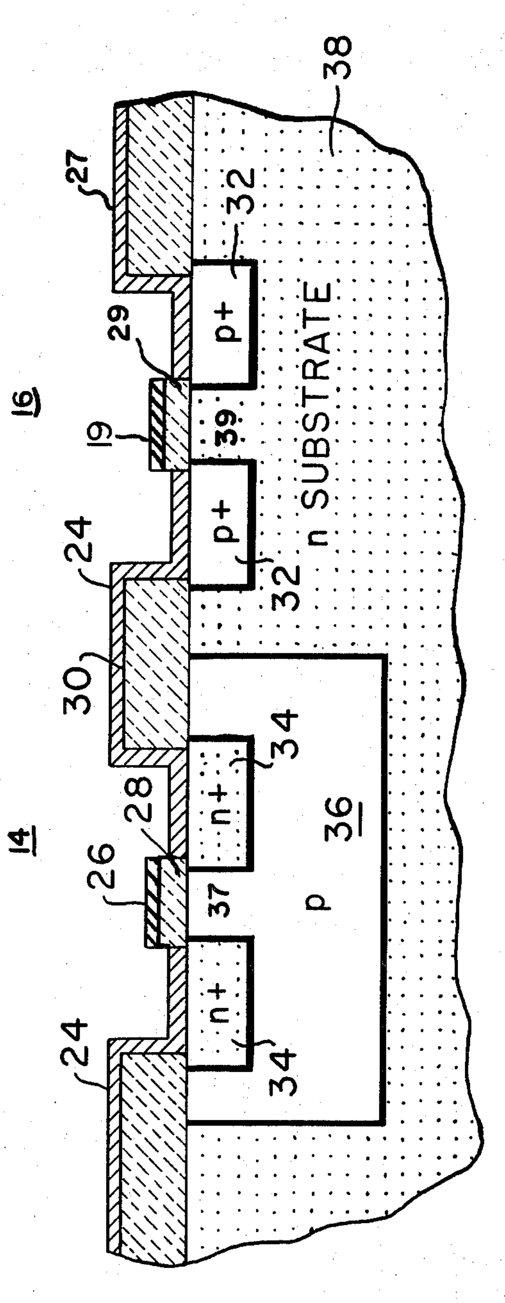
FIG. 2 is a cross-sectional view of the intrinsic structure of the CMOS device.

FIG. 2 depicts the intrinsic nature of the CMOS device shown in FIG. 1. Sources 10 and 12 correspond to aluminum layers 24 and 27, gates 20 and 22 correspond to metallic layers 26 and 19 while drain 18 corresponds to the layer 30.

The CMOS structure as shown in FIG. 2 is made of N-type silicon substrate 38 although the substrate may be of any other suitable semiconductor.

The manufacture of the device begins with the cleaning of the entire substrate 38 by well known methods. This may include, for example, ultrasonic or chemical cleaning. Conventional photolithographic techniques are then employed to mask the N-channel section 14 while the P+ regions 32 are deposited on the clean substrate. The substrate is then subjected to any well known doping means such as thermal diffusion of boron to make these areas 32 heavily P+ ($10^{18}$ atoms/cc). Also, this doping may be effected by ion implantation techniques. The photoresist is then removed from the N-channel section.

The P-channel section 16 is then covered with photoresist so that processing may be done on the N-section 14. A mask (not shown) is constructed to cover the entire semiconductor except for the p-well region 36. The p-well 36 is doped by any known means, such as thermal diffusion of boron ($10^{16}$ atoms/cc). The p-well mask is removed and is set aside for future use. A source and drain mask (not shown) is then placed over the p-well 36 to provide for the deposit of source 10 and drain 18 by using N+ materials 34. The N+ doping agent may be phosphorous and is applied by any method acceptable to the art such as thermal diffusion or ion implantation.

Most of the manufacturing processes known to the prior art produce contaminated layers of $SiO_2$ on the substrate in the channels 37 and 39. It has been determined that the cleanliness of the channel oxide in both the P-channel and the N-channel transistors affect the radiation sensitive nature of the CMOS device. To reduce this sensitivity, the "dirty" $SiO_2$ should be removed and new oxide grown. Also, both gate dielectrics 28 and 29 should each have a low alkali content (such as sodium and potassium) to decrease the positive space charge which accumulates in the gate region as will be explained later. This may be accomplished by utilizing materials possessing low alkali content as well as exercising control over processing and handling techniques.

The charge transport and trapping within the $SiO_2$ gate dielectrics 28 and 29 are now modified so as to reduce the positive charge build-up which occurs when the device is exposed to radiation. That is to say, during irradiation, the positive space charge which builds up near the silicon-silicon dioxide interface for positive gate biases, and near the gate metal-silicon dioxide for negative gate biases is greatly reduced.

It has been determined that the magnitude of this space charge significantly depends on the impurities within the $SiO_2$ gate dielectric. By minimizing the alkali content, as explained above, the radiation sensitive nature of the CMOS device is substantially diminished. Furthermore, the proper sintering of the aluminum gate metalization allows the aluminum to significantly penetrate the $SiO_2$ to further reduce the space charge build-up near the outer metal-silicon dioxide interface. This sintering process includes for example, placing the CMOS in a furnace with a dry nitrogen atmosphere at a temperature such as 500°C for approximately 30 minutes.

In order to reduce the radiation-induced space-charge for N-channel transistors, ion implantation such as of aluminum is efficacious. Thus, while the $SiO_2$ regions of the P-channel transistors are masked, ion implantation is effected in the adjacent N-channel section. A convenient mask for this purpose is the existing p-well mask which was used for the p-well diffusion.

Figure 3:
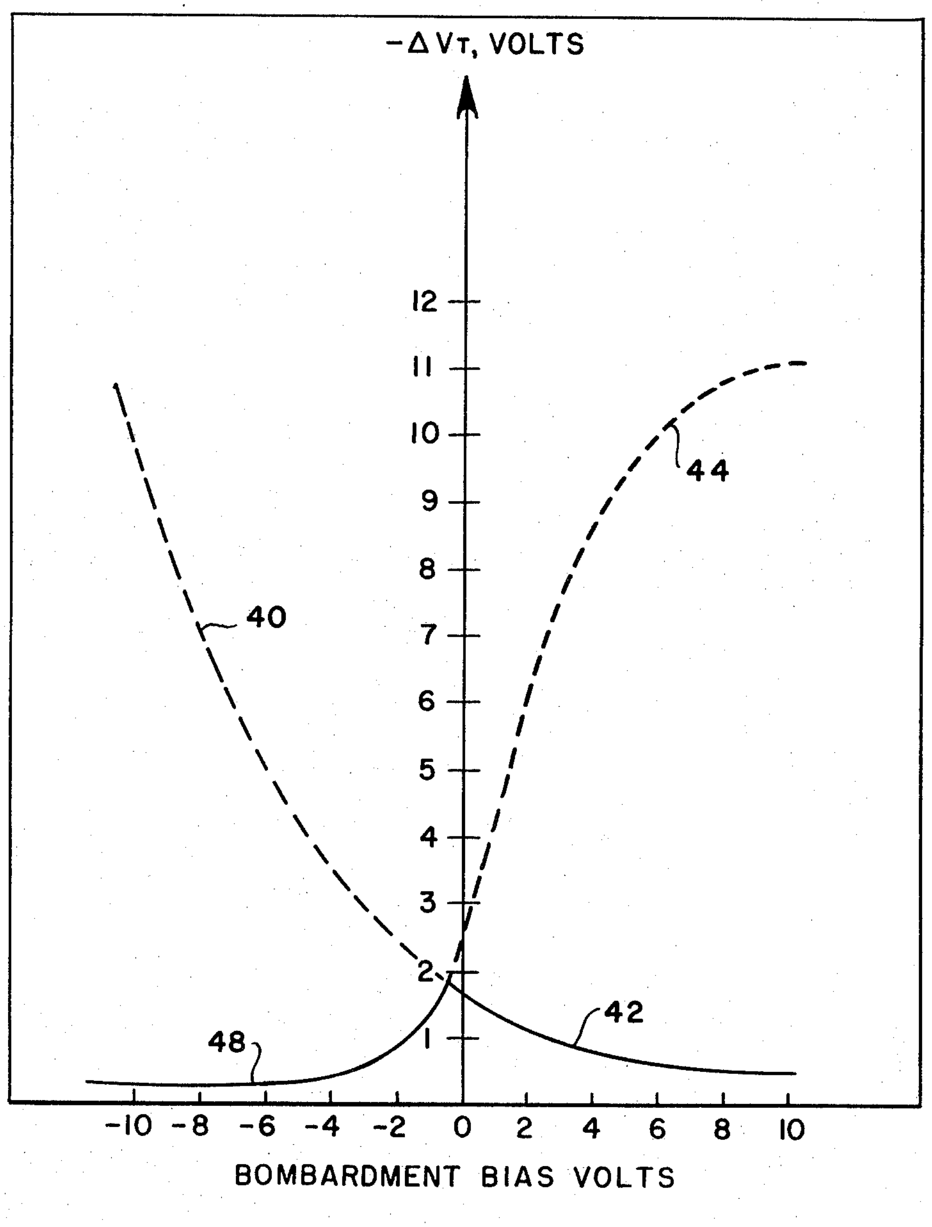
FIG. 3 is a graph of threshold voltage change versus bombardment voltage for an undoped and ion implanted CMOS.

Referring to FIG. 3, the curve consisting of segments 40 and 42 represents the threshold level for ion implanted $SiO_2$ (for example, 35 KeV, $Al^+$ $10^{15}/cm^2$). The curve consisting of segments 44 and 48 represent the threshold voltage for undoped $SiO_2$. Both dashed-line segments 40 and 44 represents unacceptable levels of threshold voltage change. As a result of this invention, these unacceptable threshold levels may be improved consistent with the solid line graph segments 48 and 42, respectively. This may be accomplished by masking (metallic or photoresist) the P-channel and subjecting the N-channel to ion implantation, such as aluminum.

The procedures disclosed herein allow the realization of radiation hard CMOS devices and circuits heretofore unattainable.

Although the ion of aluminum has been consistently referred to, it should be noted that the ions of boron and neon may also lend themselves well to the above teachings.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of radiation hardening a Complementary-Metal-Oxide-Semiconductor device having an N-channel and a P-channel component comprising:
subjecting the dielectric of the N-channel component to ion implantation to prevent positive space charge buildup upon exposure to radiation.

2. The method as claimed in claim 1 wherein the ion implantation is aluminum ion implantation.

3. The method of claim 1 further including:
masking the P-channel component before subjecting the N-channel component to ion implantation so that no ion implantation takes place in the P-channel component.

4. The method of claim 1 wherein the N-channel dielectric is a gate dielectric.

5. The method of claim 4 wherein the dielectric is silicon-dioxide.

* * * * *